United States Patent [19]

Umetsu et al.

[11] Patent Number: 4,866,576
[45] Date of Patent: Sep. 12, 1989

[54] STRUCTURE OF SHELF TO BE FIXED TO FRAME OF COMMUNICATIONS APPARATUS

[75] Inventors: Toshimasa Umetsu; Yoetsu Aota, both of Tokyo, Japan

[73] Assignee: NEC Corporation, Japan

[21] Appl. No.: 200,418

[22] Filed: May 31, 1988

[30] Foreign Application Priority Data

May 29, 1987 [JP] Japan .................................. 62-82363

[51] Int. Cl.$^4$ ........................... H02B 1/02; H05K 7/18
[52] U.S. Cl. ...................................... 361/429; 211/41; 361/415
[58] Field of Search ............... 361/380, 383, 384, 394, 361/395, 399, 413, 415, 429; 211/41

[56] References Cited

U.S. PATENT DOCUMENTS

| 3,231,785 | 1/1966 | Calabro | 361/383 |
| 3,640,399 | 2/1972 | Hartman | 361/415 |
| 4,013,928 | 3/1977 | Sarinopoulos et al. | 361/380 |
| 4,574,332 | 3/1986 | Calabro | 361/415 |

FOREIGN PATENT DOCUMENTS

| 8302225 | 1/1985 | Netherlands | 361/415 |
| 892184 | 3/1962 | United Kingdom | 361/399 |

OTHER PUBLICATIONS

Harrod, William, et al., "The *Bellpac* Packaging System"; *The Engineer Western Electric*, (Third Issue, 1983), pp. 5–15.

Primary Examiner—Gregory D. Thompson
Attorney, Agent, or Firm—Leydig, Voit & Mayer

[57] ABSTRACT

An improved mounting apparatus of a shelf housing printed circuit boards in a frame is provided. The shelf is designed to prevent mechanical damage to itself and to the printed circuit boards inside the shelf in the event of deformation of the frame due to vibration during transportation or earthquakes. Guide members which enclose the printed circuit boards are fastened to supporting members in such a manner that the guide members can shift position lengthwise along the supporting members. Thus, mechanical stress causing the frame to deform from a rectangle into a parallelogram does not also deform the guide members holding the printed circuit boards. Accordingly, damage to soldered connections or circuit components on printed circuit boards is prevented.

18 Claims, 8 Drawing Sheets

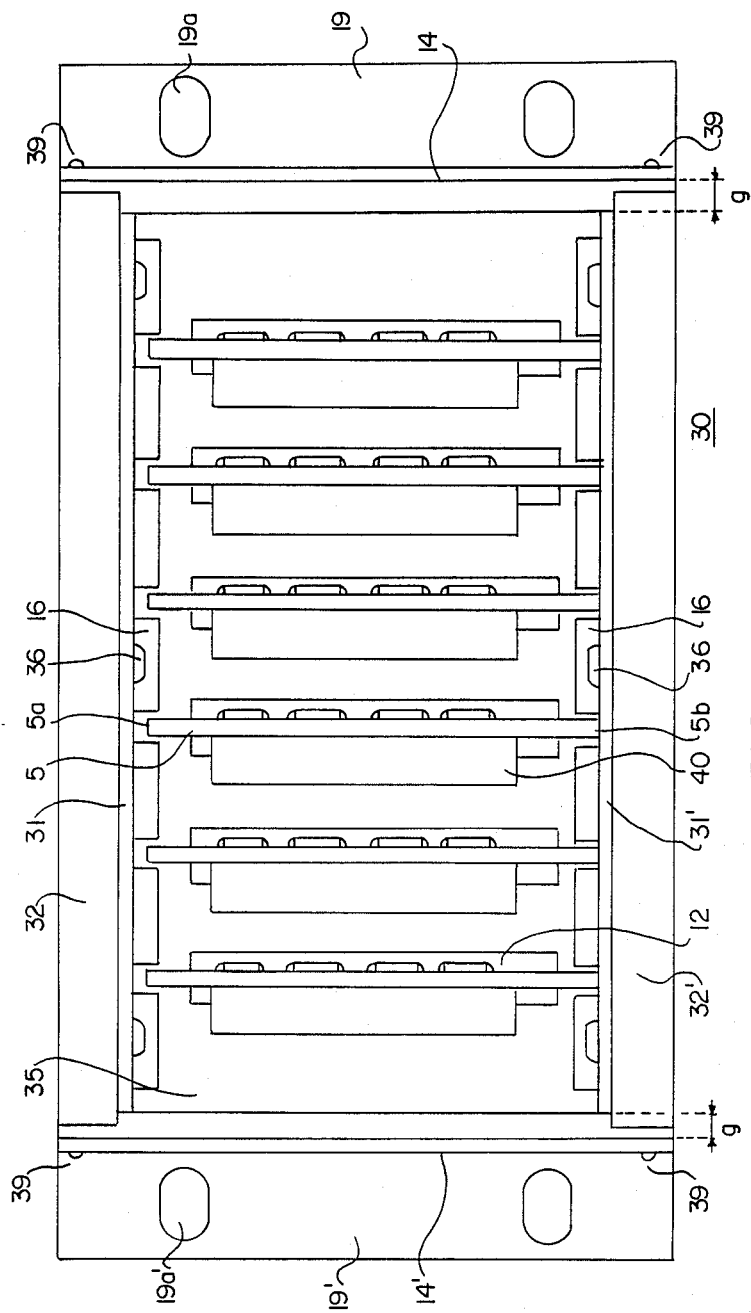

STRUCTURE OF SHELF TO BE FIXED TO FRAME OF COMMUNICATIONS APPARATUS

BACKGROUND OF THE INVENTION

The present invention relates to the structure of a shelf to be housed in the frame of a communications apparatus, and more particularly to the structure of a shelf accommodating a plurality of circuit cards (printed circuit boards) mounted with electric circuits.

The frame of a communications apparatus by the prior art typically consists of at least two props, a base holding the bottoms of those props and a connecting frame holding the tops of those props, and a plurality of shelves each accommodating a plurality of printed circuit boards are fixed to the frame in a row along the props. The shelves are open on the front side, from which the printed circuit boards are inserted into the shelves vertically. The shelves have guide members for holding the top and bottom ends of the boards, a back plane having connectors which the printed circuit boards are plugged into, and side plates which are firmly bolted to the guide members and back plane (see "The Bellpac Packaging System" in Western Electric, THE ENGINEER, third issue 1983, pp. 5–15).

The prior art communications apparatus referred to above involves the problem that its frame is deformed into a parallelogram, with its props inclined, by vibration during transportation or by earthquakes. This results in the disadvantage that the side plates of the shelves fixed to the props of the frame are inclined, and the parts fixing the back plane to the guide members and the back plane to the side plates are strained, often inviting the rupture of these parts.

The inclination of the shelves' side plates causes the further disadvantage that the top and bottom ends of the printed circuit boards held by the guide members of the shelves are dislocated in reverse directions to each other, resulting in the distortion of the boards, and consequently the circuit components mounted on the boards may come off or the connecting parts between the boards and the connectors on the back plane may get broken.

SUMMARY OF THE INVENTION

An object of the present invention is to provide a shelf which, even if it is deformed by any deformation of the frame of a communications apparatus, protects the printed circuit boards within and thereby ensures the reliability of the boards.

Another object of the invention is to provide a shelf which can contribute to reducing the damages of guide members, a back plane and side members constituting the shelf.

A shelf according to the invention is fixed to the frame of a communications apparatus having at least two props disposely spaced in parallel a predetermined distance apart from each other, and accommodates a plurality of printed circuit boards mounted with electric circuits. The shelf includes a pair of side plates fixed along the props to the frame of the communications apparatus, the faces of the side plates opposite to each other in parallel to the props of the frame, and first and second supporting members arranged between the side plates perpendicular to the surfaces of the side plates, with the two ends of each being fixed to the upper and lower parts, respectively, of the side plates. The shelf further includes first and second guide members connected to the first and second supporting members wit sliding joint fasteners, respectively so, as to be slidable along the first and second supporting members in a direction perpendicular to the surfaces of the side plates, and intended to hold the faces of the printed circuit boards in a position parallel to the faces of the side plates, and back members fixed behind the shelf to the first and second guide members. The guide members and back members are not ifxed to the side plates, and arranged at prescribed distances from the side plates, and there are gaps between the top ends of the printed circuit boards and the guide members. That the first and second supporting members and the first and second guide members are not fixed to each other but are shiftable constitutes an essential aspect of the present invention.

BRIEF DESCRIPTION OF THE DRAWINGS

The above and other objects, features and advantages of the present invention will become more apparent from the following detailed description taken in conjunction with the accompanying drawings, in which:

FIG. 6 shows a magnified front view of the shelf of FIG. 4;

DETAILED DESCRIPTION OF THE PREFERRED EMBODIMENTS

With a view to facilitating the understanding of preferred embodiments of the present invention, the frame and shelves for a communications apparatus by the prior art will be described first.

Figure 1:
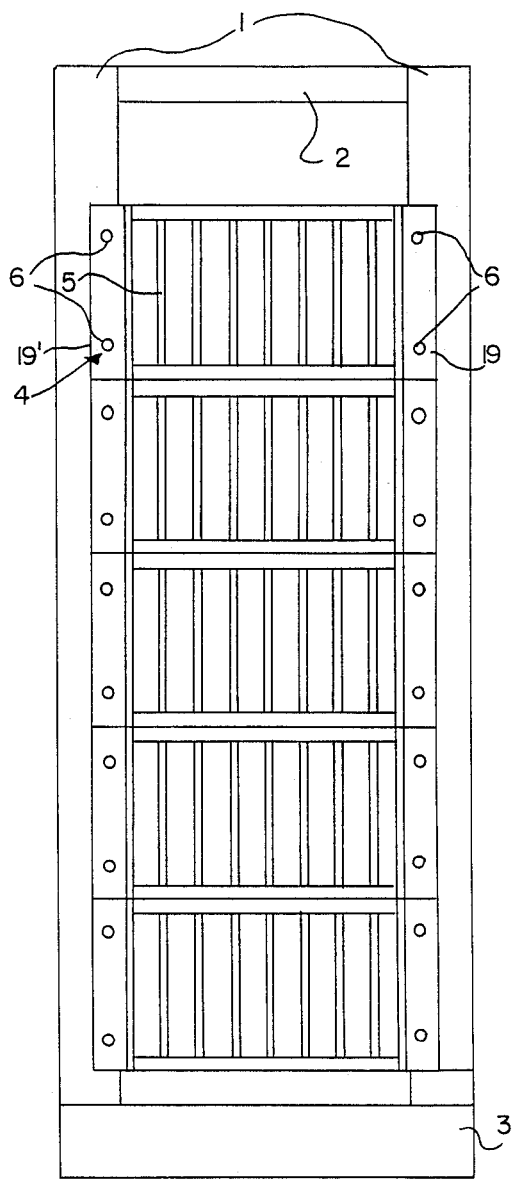
FIG. 1 shows a front view of a communications apparatus by the prior art.

In FIG. 1, the frame of a prior art communications apparatus includes a pair of props 1 of about seven feet in length, spaced in parallel a predetermined distance apart from each other, a fixed top member 2 for supporting the tops of the props 1, and a base 3 for joining and fixing the bottoms of the props 1. Five shelves 4, each accommodating a plurality of circuit cards (printed circuit boards) 5 mounted with electric circuits, are fixed along the props 1 with bolts 6. In the example of FIG. 1 in particular, communication cables are housed within the props 1.

Figure 2:
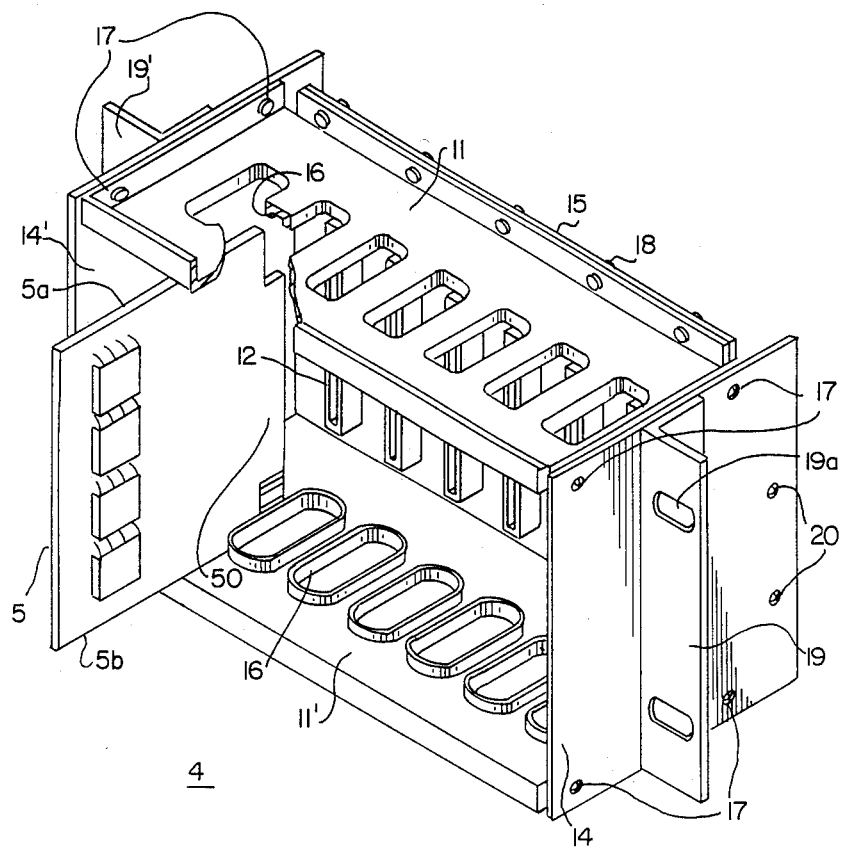
FIG. 2 shows an oblique view of a prior art shelf fixed to the frame of the communications apparatus of FIG. 1.

Each of the shelves 4, as illustrated in FIG. 2, has a pair of guide plates 11 and 11' having guides 16 for guiding the printed circuit boards 5 in an upright position and holding their top and bottom ends; side plates 14 and 14'; and a back plate 15 arranged behind the shelves 4. Each of the four sides of the guide plates 11 and 11' is rectangularly bent, and the bent edges are fixed to the side plate 14 or 14' with bolts 17 and to the back plate 15 with bolts 18. The back plate 15 and the side plates 14 and 14' are fixed to each other with bolts 20. To the front side of the back plate 15 are fixed a plug-in connector 12 to match the connecting portion 50 of the printed circuit boards 5. The connectors 12 are connected to cables not shown.

Each of the printed circuit boards 5 is inserted from the front of the shelf 4 along the corresponding guides 16 until it is connected to the corresponding connector 12. After plug-in connection, two ends 5a and 5b of the printed circuit board 5 are held between the guides 16.

The shelf 4 is fixed to the props 1 with the bolts 6 (FIG. 1) by way of holes 19a and 19a' formed in fitting plates 19 and 19' fixed to the side plates 14 and 14', respectively.

Figure 3:
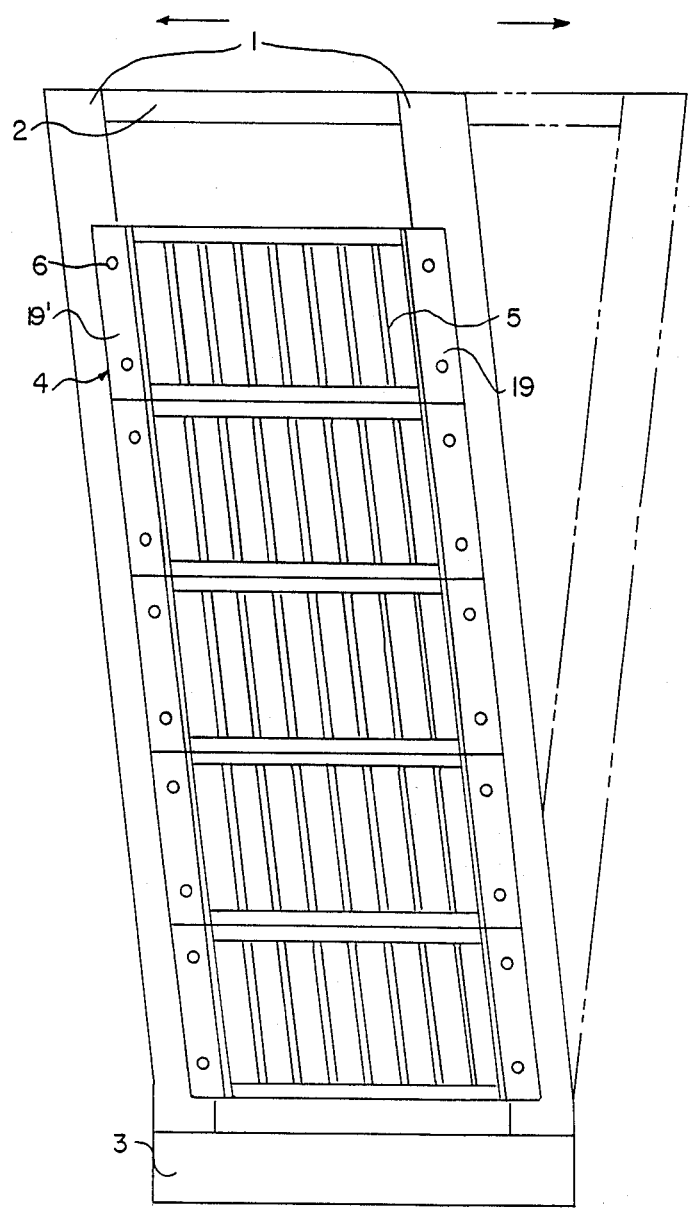
FIG. 3 shows a front view of the communications apparatus of FIG. 1 having been deformed by lateral vibrations.

However, the frame is inclined right and left by lateral vibration during transportation or by earthquakes, as illustrated in FIG. 3, and elastically deformed into a parallelogram, and the shelf 4 is also deformed similarly to the frame. Therefore, the joining parts of the shelf 4 between the back plate 15 and the guide plates 11 and 11', between the back plate 15 and the side plates 14 and 14', and between the guide plates 11 and 11' and the side plates 14 and 14' are subjected to heavy impacts, and thereby damaged. An even more serious hazard can be the dislocation of soldered parts or straining of circuit components on the printed circuit boards, which, held by the guides 16, are inclined and bent by the shifting of the guide plates 11 and 11' in relative positions, which in turn would result from the deformation of the shelf 4.

The present invention is intended to prevent the damaging of shelves and the twisting of printed circuit boards by lateral vibration.

Figure 4:
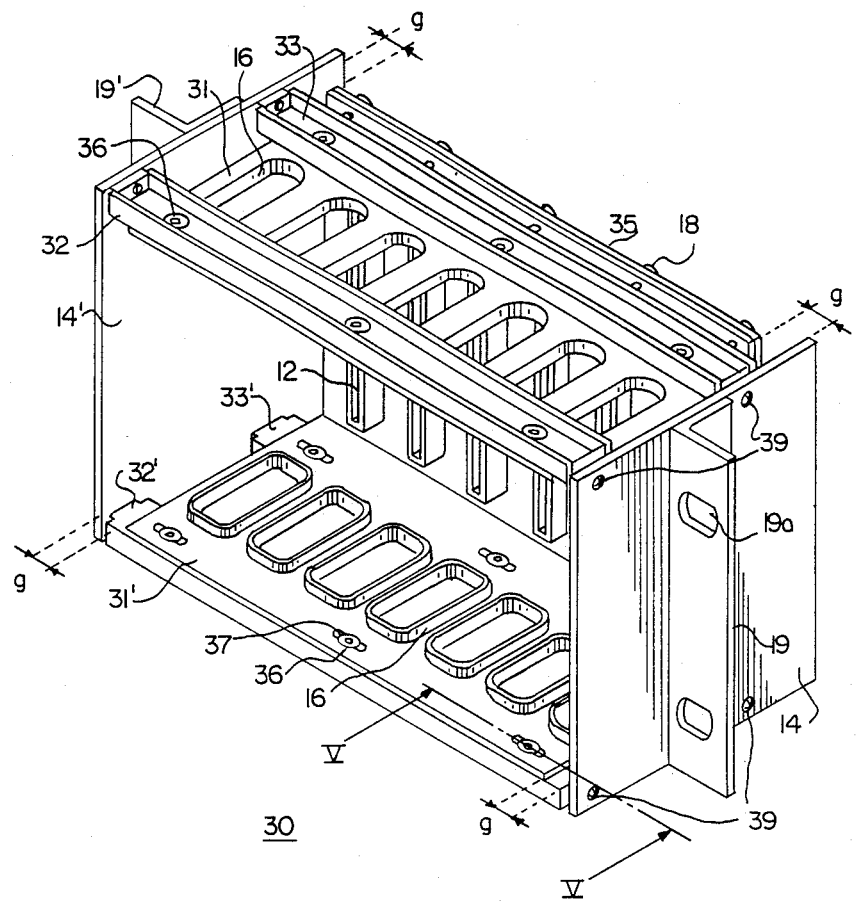
FIG. 4 shows an oblique view of a shelf according to the present invention.

Referring now to FIG. 4, a shelf 30 according to the invention includes guide plates 31 and 31' having a plurality of annular guides 16 for guiding and holding printed circuit boards; a pair of side plates 14 and 14'; supporting members 32, 33, 32' and 33' fixed between and perpendicular to the side plates 14 and 14', a back plate 35, and fitting plates 19 and 19' fixed to the side plates 14 and 14'.

The guide plates 31 and 31' are so arranged to be parallel to each other. The guides 16 are arranged at intervals each substantially equal to the thickness of a printed circuit board so that the printed circuit boards can be held perpendicular to the guide plates 31 and 31'. The guides 16 have holes through which to discharge, out of the shelf, the heat generated in the printed circuit boards. The guide plates 31 and 31' are fixed to the back plate 35 with bolts 18, and connected to the supporting members 32, 33 in a sliding joint, 32', 33' via sliding joint fasteners here depicted as rivets 36 so as to be slidable along the supporting members, as will be elaborated upon below. Three rivets 36 are used per supporting member. The side plates 14 and 14' are fixed only to the ends of the supporting members 32, 32', 33 and 33' with bolts 39, but not to the guide plates 31 and 31' and the back plane 35. There further are first gaps g between the side plates 14 and 14' on the one hand and the guide plates 31 and 31' and the back plane 35 on the other.

The shelf 30 is fixed to the props 1 of FIG. 1 with bolts 6 by way of hoels 19a and 19a'.

Figure 5:
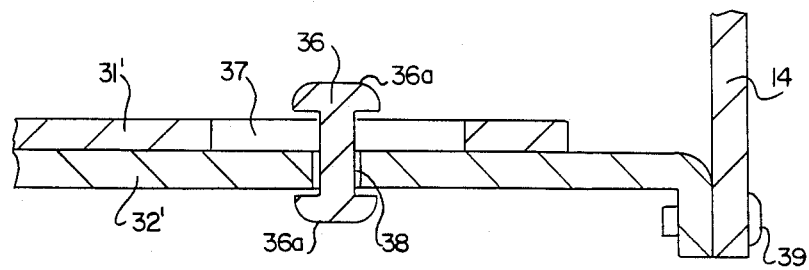
FIG. 5 shows a magnified cross-sectional view of the V—V portion of FIG. 4.

The connection of the supporting members 32, 32', 33 and 33' to the guide plates 31 and 31' via the rivets 36 are typically illustrated in FIG. 5, wherein the connecting part between the supporting member 32' and the guide plate 31' is magnified, and every point of connection by way of a rivet 36 is the same as what is shown in FIG. 5.

Referring to FIG. 5, the guide plate 31' has a hole 37 in the lengthwise direction of the supporting member 32', while the supporting member 32' has a round hole 38 in a position opposite to the long hole 37. The rivet 36, inserted into the long hole 37 and the round hole 38, is slightly longer than the combined thickness of the guide plate 31' and the supporting member 32'. The diameter of two heads 36a of the rivet 36 is greater than the width of the long hole 37 and the diameter of the round hole 38, so that the rivet 36 may not come off the holes 37 and 38.

Therefore, each of the guide plates 31 and 31' can shift in the lengthwise direction of the supporting members 32, 33, 32' and 33' within a range equivalent to the length of each long hole 37. This shiftability plays an important role, as will be elaborated upon below, in protecting the printed circuit boards held by the guide plates 31 and 31'.

FIG. 6 shows a magnified front view of the shelf 30 of FIG. 4 after a plurality of printed circuit boards 5 have been placed in it. Each of the printed circuit boards 5 is fitted with a catch 40 so that it can be readily inserted into the shelf. Two ends 5a and 5b of the printed circuit board 5 are held between the guides 16 respectively, and the connecting part at the rear-end of the board 5 is plugged into a connector 12 on the back plate 35. Usually there is a second gap of about 1 mm between the top end 5a of the printed circuit board 5 and the guide plate 31 to facilitate insertion of the board 5 between the guide plates 31 and 31'. This second gap, as will be elaborated upon below, plays an important part in protecting the printed circuit board 5 against any inclination of the shelf 30.

Figure 7:
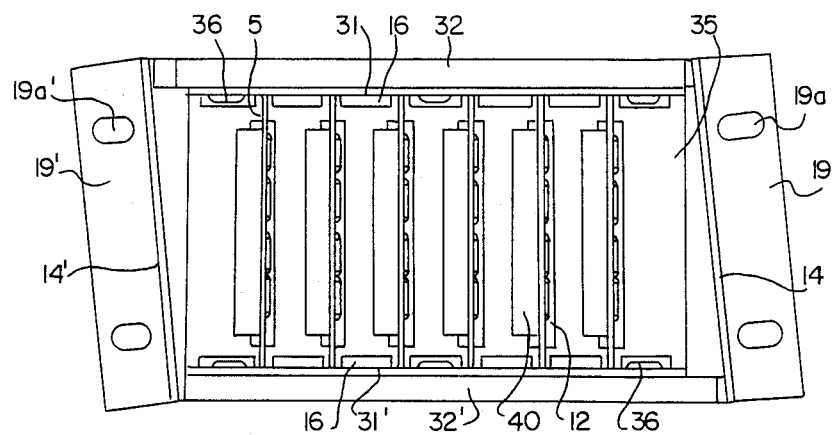
FIG. 7 shows a front view of the shelf of FIG. 4 in a deformed state.

Now if the frame of the communications apparatus is inclined by an earthquake or vibration during transportation in the lengthwise direction of the top member 2 as shown in FIG. 3, the side plates 14 and 14' of the shelf 30 will incline to deform the structure consisting of the side plates 14 and 14' and the supporting members 32, 33, 32' and 33' into a parallelogram, as illustrated in FIG. 7. While, at this time, the supporting members 32 and 33 shift in the opposite direction to the supporting members 32' and 33', they slide on the rear sides of the guide plates 31 and 31' in the lengthwise direction of the long holes 37 (FIG. 4), so that the guide plates 31 and 31' do not shift together with the supporting members 32, 33, 32' and 33'. Therefore the printed circuit boards 5 will remain unmoved even if the side plates 14 and 14' incline. As the side plate 14 is not fixed to the guide plates 31 and 31' and the back plate 35 and, moeover, there are the gaps g between the side plates 14, 14' on the one hand and the guide plates 31, 31' and the back plate 35 on the other, neither the guide plates 31 and 31' nor the back plate 35 will be damaged even if the side plates 14 and 14' incline. If the side plates 14 and 14' incline, the distance between the guide plates 31 and 31' will become slightly narrower tha it normally is, but the difference is less than 1 mm in most cases. For instance if the frame of the communications apparatus has props of 2 m each in length, the top of each prop will shift by about 10 cm in the horizontal direction when the inclination of the props is at its extreme. If, in this instance, the height of the shelf (the length of each prop 1) fixed to the frame is 20 cm, the shelf will shift in the horizontal direction by about 1 cm at the maximum, and the shelf height will become 0.25 mm less than it normally is. However, since the decrement can be absorbed by the (1 mm) second gap between the top end 5a of the printed circuit board 5 and the guide plate 31 as illustrated in FIG. 6, the board 5 will not be affected.

Figure 8:
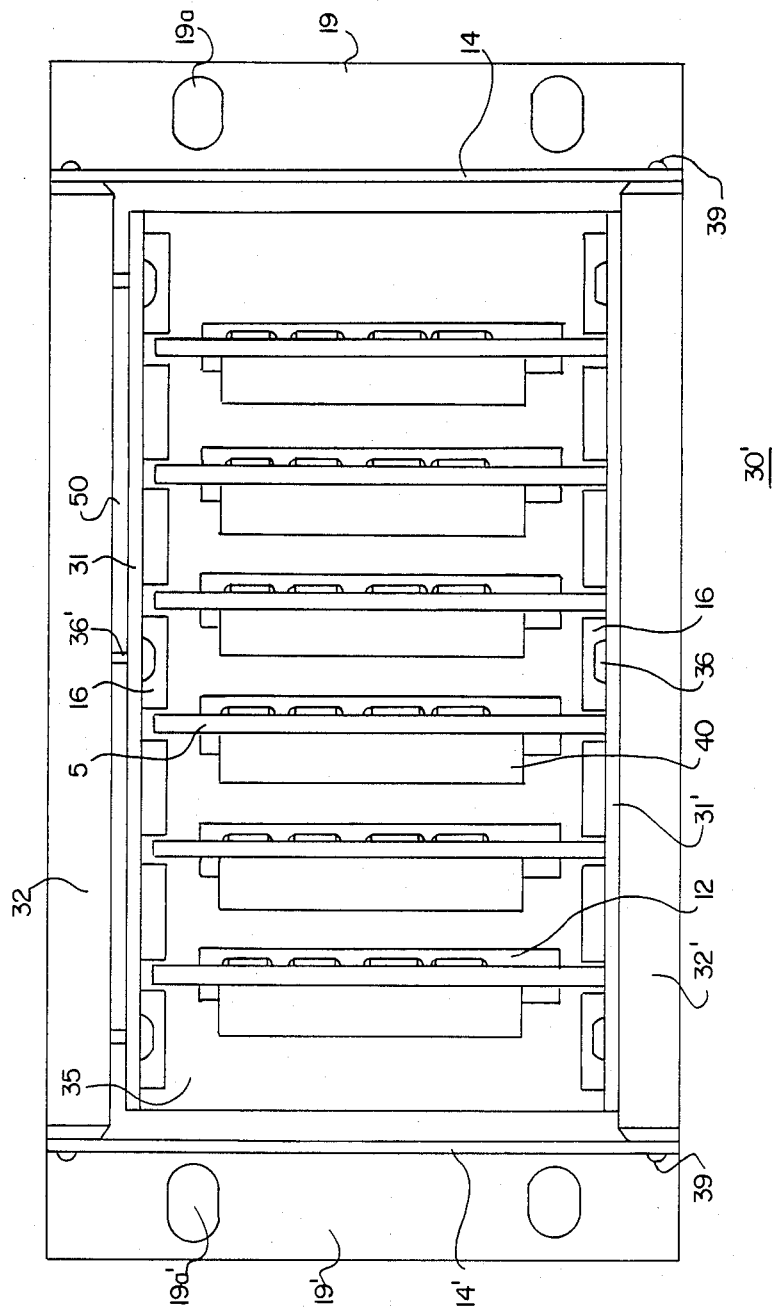
FIG. 8 shows a magnified front view of another shelf according to the invention.

FIG. 8 shows a front view of a modified version of the shelf of FIG. 6, and a shelf 30' here has the same structure as the shelf 30 of FIG. 6 except that there are third gaps 150 between the guide plate 31 and the supporting members 32 and 33.

In FIG. 8, the third gap 150 is formed by making upper rivets 36' longer than lower rivets 36. The shelf 30' is so structured as to make it impossible for the supporting members 32 and 33 to press the guide plate 31 downward by the height decrease resulting from the inclination of the side plates 14 and 14' with the third gap 150. Therefore, not only the printed circuit boards but also the guide plates and back plane can be fully protected.

Figure 9:
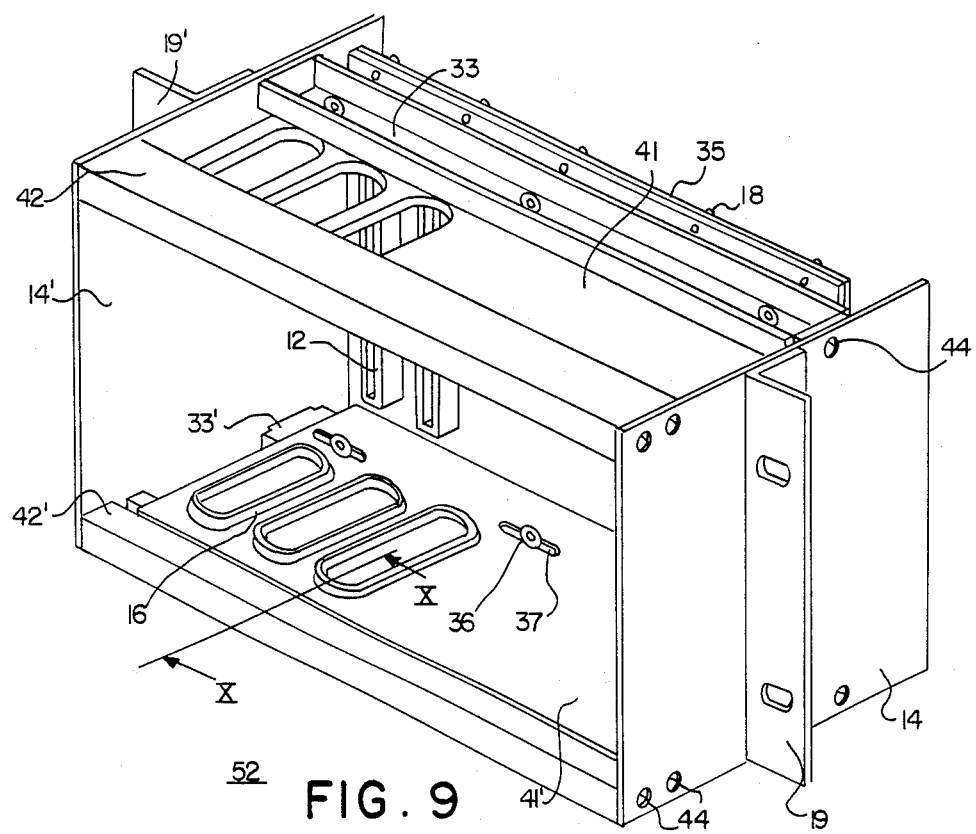
FIG. 9 shows an oblique view of still another shelf according to the invention.
Figure 10:
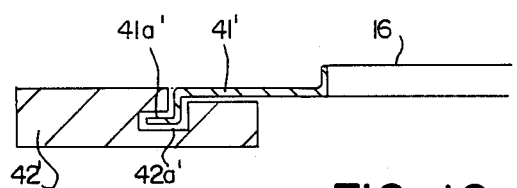
FIG. 10 shows a magnified cross-sectional view of the X—X portion of FIG. 9.

FIG. 9 shows an oblique view of still another shelf embodying the present invention and FIG. 10, a magnified cross-sectional view of the X—X portion of FIG. 9.

A shelf 52 of this preferred embodiment is composed of the same components as the shelf 30 of FIG. 4 except that the supporting members 32 and 32' ae replaced here with supporting members 42 and 42', and the guide plates 31 and 31', with guide plates 41 and 41', respectively.

The supporting members 42 and 42', fixed at two ends to the side plates 14 and 14' with bolts 44, are parallel to the supporting members 33 and 33'. No rivets 36 are used for joining the supporting members 42 and 42' to the guide plates 41 and 41'. Instead, the sliding joint fastener is shown as an L-shaped fringe 41a' disposed on the guide plate 41'. The fringe 41a' is fitted into an L-sectioned groove 42a' as illustrated in FIG. 10. The L-sectioned groove 41a' is formed in the lengthwise direction of the suppoting member 42', and the L-sectioned fringe 41a' can slide in the L-sectioned groove 42a' in the lengthwise direction of the supporting member 42'. The guide plate 41 is joined to the supporting member 42 in the same manner as shown in FIG. 10.

The guide plates 41 and 41' are fixed to the back plate 35 with the bolts 18, but not to the side plates 14 and 14' or the supporting members 33, 42, 33' and 42'. Therefore, if the side plates 14 and 14' are inclined by lateral vibration of the frame of the communications apparatus as illustrated in FIG. 7, the supporting members 33 and 42 and the supporting members 33' and 42' will shift in reverse directions to each other, but the guide plates 41 and 41' will not shift together with the supporting members. Accordingly, the printed circuit boards held between the guide plates 41 and 41' remain unmoved, and their safety is ensured. As there are the first gaps g between the side plates 14 and 14' on the one hand and the guide plates 41 and 41' and the back plate 35 on the other, no inclination of the side plates 14 and 14' would damage any of the guide plates or the back plate. If the side plates 14 and 14' incline, the height of the shelf 40 will decrease, but the decrement, as mentioned above, will be less than 1 mm, so that there will be no problem only if there is a gap of about 1 mm each between each printed circuit board and the guide plate 41.

The application of the present invention is not limited to the structures of the preferred embodiments described above. For instance, through the long holes 37 into which the rivets 36 are to fit are opened in the guide plates 31 and 31', and the round holes 38 in the supporting members 32, 32', 33 and 33' in the embodiment illustrated in FIGS. 4 and 5, the long and round holes may conversely be in the supporting members and the guide plates, respectively.

What is claimed is:

1. A shelf fixed to the frame of a communications apparatus having at least two props disposed in parallel and spaced a predetermined distance apart from each other, comprising:
    a pair of side plates having upper and lower parts and arranged to be parallel opposite to each other;
    a pair of first and second supporting members arranged between said side plates perpendicular to the surfaces of said side plates, with the two ends of each being fixed to the upper and lower parts, respectively, of said side plates;
    first and second guide members slidably joined to said first and second pairs of supporting members, respectively, the first and second guide members being shiftable along the first and second pairs of supporting members in a shifting direction perpendicular to the surfaces of the side plates, the first and second guide members holding printed circuit boards having top ends in a position parallel to the faces of said side plates; and
    a back member fixed behind said shelf to said first and second guide members, wherein
    said guide members and back member are arranged to provide first gaps between the side plates and the first and second guide members and between the side plates and the back member, and wherein
    second gaps are provided between the top ends of said printed circuit boards and said first guide member.

2. A shelf, as claimed in claim 1, wherein holes are provided in said first and second pairs of supporting members and said first and second guide members, the holes in either said supporting members or said guide members being long in the shifting direction of said guide members, and a joining member is inserted into each ole to join said supporting members and said guide members.

3. A shelf, as claimed in claim 1, wherein at least one of the supporting members includes a groove along the shifting direction of said guide members, and at least one guide member includes a part disposed in said groove.

4. A shelf, as claimed in claim 1, wherein a third gap is provided between said first pair of supporting members and said first guide member.

5. A shelf, as claimed in claim 1, wherein connectors are fixed to said back member, and said printed circuit boards are plugged into the connectors.

6. An apparatus for mounting printed circuit boards comprising:
    a frame including a plurality of props, each prop having a top and a bottom, a base holding the bottoms of the props, and a connecting frame holding the tops of the props; and
    a plurality of shelves fixed to the frame along the props, the shelves disposed vertically in a row along the props, each shelf accommodating a plurality of printed circuit boards, each shelf including:
    a plurality of side plates; a first and second pair of supporting members disposed between the side plates;

a first and a second guide member, the first guide member disposed adjacent to the first pair of supporting members, the second guide member disposed parallel to the first guide member and adjacent to the second pair of supporting members, the first and second guide members having guides for accommodating printed circuit boards between the first and second guide members;

a plurality sliding joint fasteners fastening the first guide member to the first pair of supporting members to permit the first guide member to slide along the first pair of supporting members;

a back member rigidly fixed to the first and second guide members such that the back member and the second guide member slide in unison with the first guide member; and a plurality of fitting plates fixed to the side plates and fixed to the props.

7. An apparatus as set forth in claim 6 wherein: each of the first pair of supporting members has generally round holes;

the first guide member has generally elongated holes which align with the round holes of the first pair of supporting members; and the sliding joint fasteners comprise a joining member inserted through the round and elongated holes.

8. An apparatus as set forth in claim 6 wherein:

each of first pair of supporting members has generally elongated holes;

the first guide member has generally round holes which align with the elongated holes of the first pair of supporting members; and the sliding joint fasteners comprise a joining member inserted through the round and elongated holes.

9. An apparatus as set forth in claim 6, wherein at least one of the supporting members includes a groove, and at least one guide member includes a fringe disposed in said groove, thereby forming a sliding joint.

10. A shelf for holding printed circuit boards installed in a frame, the shelf comprising:

side plates disposed inside a frame facing each other and generally parallel to props of the frame;

first and second pair of supporting members fixed to the side plates generally perpendicular to the side plates;

first and second guide members having printed circuit board guides, the guides accommodating printed circuit boards installed in the shelf, the guide members being disposed generally parallel to each other, the first guide member disposed adjacent to the first pair of supporting members, and the second guide member disposed adjacent the second pair of supporting members;

a back member fixed to the first and second guide members; and sliding joint fasteners fastening of the first and second guide members to the first and second pair of supporting members respectively, to permit the guide members and the back member to slide along the supporting members in a shifting direction generally perpendicular to the side plates.

11. A shelf as set forth in claim 10 wherein the side plates are spaced farther apart than the length of the first and second guide members, thereby providing a first gap between the side plates and the first and second guide members.

12. A shelf as set forth in claim 10 wherein:

the printed circuit boards installed in the shelf have upper edges facing the first guide member; and a distance between the first and second guide members is such that a second gap exists between the upper edges of the printed circuit boards installed in the shelf and the first guide member.

13. An apparatus as set forth in claim 10 wherein: a distance between the first and second pairs of supporting members is such that a third gap exists between the first guide member and the first pair of supporting members.

14. A shelf as set forth in claim 10 wherein:

each of the first pair of supporting members has generally round holes;

the first guide member has generally elongated holes which align with the round holes of the first pair of supporting members and the sliding joint fasteners comprise a joining member inserted through the round and elongated holes.

15. A shelf as set forth in claim 10 wherein:

each of the first pair of supporting members has generally elongated holes;

the first guide members has generally round holes which align with the elongated holes of the first pair of supporting members; and sliding joint fasteners comprise a joining member inserted through the round and elongated holes.

16. A shelf, as claimed in claim 10, wherein at least one of the supporting members includes a groove along the shifting direction of said guide members, and at least one guide member includes a fringe disposed in said groove.

17. A shelf as set forth in claim 16 wherein the groove and the fringe are L-shaped.

18. A shelf as set forth in claim 10 further comprising fitting plates fixed to the side plates for mounting the shelf inside the frame.

* * * * *